(12) United States Patent
Ngyuen et al.

(10) Patent No.: US 7,088,127 B2
(45) Date of Patent: Aug. 8, 2006

(54) ADAPTIVE IMPEDANCE OUTPUT DRIVER CIRCUIT

(75) Inventors: Huy M. Ngyuen, San Jose, CA (US); Chanh V. Tran, San Jose, CA (US)

(73) Assignee: Rambus, Inc., Los Altos, CA (US)

( * ) Notice: Subject to any disclaimer, the term of this patent is extended or adjusted under 35 U.S.C. 154(b) by 109 days.

(21) Appl. No.: 10/662,204

(22) Filed: Sep. 12, 2003

(65) Prior Publication Data
US 2005/0057275 A1 Mar. 17, 2005

(51) Int. Cl.
*H03K 19/003* (2006.01)

(52) U.S. Cl. .............................. 326/30; 326/34; 326/80
(58) Field of Classification Search ............. 326/30–34, 326/80–83; 327/108–109; 361/56–57
See application file for complete search history.

(56) References Cited

U.S. PATENT DOCUMENTS

| | | | |
|---|---|---|---|
| 5,182,467 A | 1/1993 | Taylor et al. ................ 327/175 |
| 5,194,765 A | 3/1993 | Dunlop et al. ................ 326/87 |
| 5,254,883 A | 10/1993 | Horowitz et al. ............. 326/30 |
| 5,373,477 A | 12/1994 | Sugibayashi ................ 327/541 |
| 5,430,400 A | 7/1995 | Herlein et al. ............... 327/108 |
| 5,530,377 A | 6/1996 | Walls .......................... 326/30 |
| 5,576,640 A * | 11/1996 | Emnett et al. ................ 326/83 |
| 5,581,197 A * | 12/1996 | Motley et al. ................ 326/30 |
| 5,783,956 A | 7/1998 | Ooishi ........................ 327/143 |
| 5,821,808 A | 10/1998 | Fujima ........................ 327/538 |
| 5,847,578 A | 12/1998 | Noakes et al. ................ 326/39 |
| 5,933,051 A | 8/1999 | Tsuchida et al. ............. 323/315 |
| 5,949,254 A | 9/1999 | Keeth .......................... 326/87 |
| 5,959,481 A | 9/1999 | Donnelly et al. ........... 327/170 |
| 6,047,346 A | 4/2000 | Lau et al. .................... 710/126 |
| 6,157,206 A * | 12/2000 | Taylor et al. ................. 326/30 |
| 6,163,178 A | 12/2000 | Stark et al. .................. 327/108 |
| 6,222,354 B1 | 4/2001 | Song ........................... 323/273 |
| 6,307,791 B1 * | 10/2001 | Otsuka et al. ......... 365/189.05 |
| 6,342,800 B1 | 1/2002 | Stark et al. .................. 327/170 |
| 6,577,154 B1 * | 6/2003 | Fifield et al. ................. 326/30 |
| 6,618,786 B1 | 9/2003 | Sidiropoulos et al. ...... 710/305 |
| 6,657,468 B1 | 12/2003 | Best et al. ................... 327/170 |
| 6,661,268 B1 | 12/2003 | Stark et al. .................. 327/170 |

FOREIGN PATENT DOCUMENTS

| | | |
|---|---|---|
| EP | 0 463 316 A1 | 1/1992 |
| EP | 0 482 392 A2 | 4/1992 |
| JP | 58-54412 A | 3/1983 |

OTHER PUBLICATIONS

Chappell, Terri, I. et al., "A 2ns Cycle, 4ns Access 512 kb CMOS ECL SRAM", *IEEE International Solid State Circuits Conference*, 1991, pp. 50–51, No Month.

(Continued)

*Primary Examiner*—James H. Cho
(74) *Attorney, Agent, or Firm*—Morgan, Lewis & Bockius LLP (57) ABSTRACT

Disclosed is an output driver having an output port for outputting a data signal, a level shifter for driving a current to the output port in response to a current control input, an adjustable impedance controller for generating an impedance adjustment signal; an output impedance compensator for adjusting the impedance of the level shifter in accordance with the impedance adjustment signal and in accordance with a reference voltage, and a tracking circuit, including a process and temperature monitor responsive to manufacturing process and temperature variations of the output driver, a frequency monitor responsive to the frequency of an input clock signal, and a voltage supply monitor responsive to an internal power supply voltage. The process and temperature monitor, frequency monitor and voltage supply monitor are interconnected so as to generate the reference voltage.

33 Claims, 4 Drawing Sheets

OTHER PUBLICATIONS

Donnelly, Kevin S. et al., "A 660 MB/s Interface Megacell Portable Circuit in 0.3 μm–0.7 μm CMOS ASIC", *IEEE Journal of Solid State Circuits,* 31(12):1995–2003 (1996), No Month.

Pilo, Harold et al., "A 300 MHz 3.3V 1 Mb SRAM Fabricated in a 0.5 μm CMOS Process", *IEEE International Solid State Circuits Conference,* pp. 148–149 (1996), No Month.

Schumacher, Hans–Jügen et al., "CMOS Subnanosecond True–ECL Output Buffer", *IEEE Journal of Solid–State Circuits*, 25(1):150–154 (1990).

Sidiropoulos, Stefanos et al., "A 700–Mb/s/pin CMOS Signaling Interface Using Current Integrating Receivers", *IEEE Journal of Solid–State Circuits*, 32(5):681–690 (1997) No Month.

EIA/JDEC, JC–42.3 Committee on RAM Memories, Minutes of Meeting 63, Jul. 21, 1992, Denver, Co.

EIA/JDEC, JC–42.3 Committee on RAM Memories, Minutes of Meeting 64, Sep. 16–17, 1992, Crystal City, Va.

Yang, Tsen–Shau et al., "A 4–ns 4Kx1–bit Two–Port BiCMOS SRAM", *IEEE Journal of D–State Circuits*, 23:(5):1030–1040 (1988).

* cited by examiner

ADAPTIVE IMPEDANCE OUTPUT DRIVER CIRCUIT

FIELD OF THE INVENTION

The present invention relates to the field of electronic circuits. In particular, the invention relates to an output driver circuit.

BACKGROUND

Integrated circuits connect to and communicate with each other. Typically, integrated circuits communicate with each other by sending and receiving electronic signals via one or more electrical interconnects. Physically, the electrical interconnects comprise traces on a printed circuit board, wires or cables that connect between the integrated circuits. One or more such electrical interconnects may be referred to as a bus. Each of the integrated circuits may have an output driver circuit for driving electronic signals via the electrical interconnects to one or more receiver integrated circuits.

Figure 1:
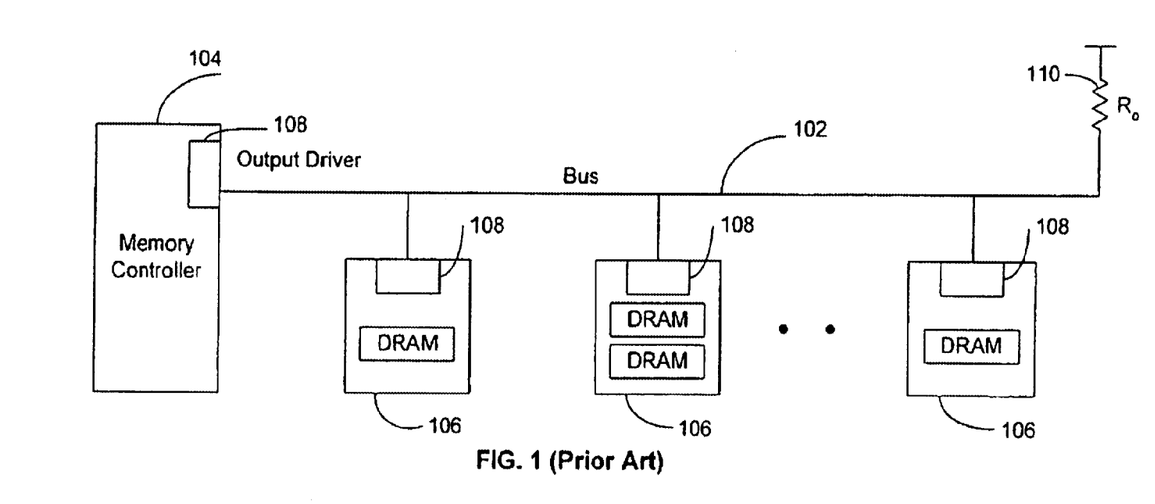
FIG. 1 illustrates one example of integrated circuits communicating with each other in a memory system.

FIG. 1 illustrates one example of integrated circuits communicating with each other in a memory system. In FIG. 1, a bus 102 interconnects a memory controller 104 and memory modules 106. Each memory module 106 may include integrated circuits such as DRAMs. The memory controller and memory module each have one or more output drivers 108 that interface with the bus 102 for communicating electronic signals with other devices on the bus. The one or more output drivers of each memory module may be located, for example, in the one or more DRAMs. The speed of signal transmission via the bus 102 is a function of many factors such as the system clock speed, the amount of output current, the supply voltage, the number of loads on the bus, the impedance of the bus, the length of the bus, and the layout of the bus. The one or more conductors of the bus are sometimes referred to as channels. In some systems, all channels connect to a set of pull-up resistors $R_0$ 110 (one per channel, with just one being shown in FIG. 1).

Figure 2:
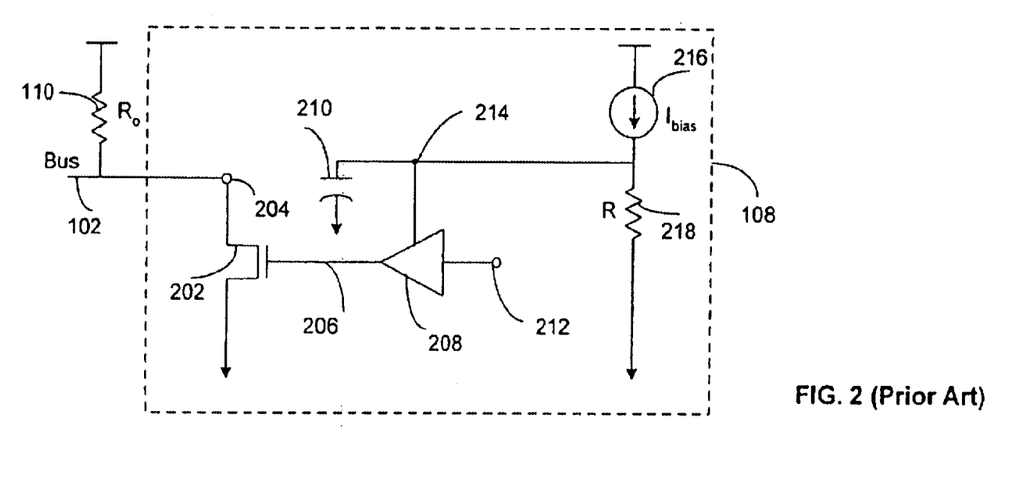
FIG. 2 illustrates a prior art circuit diagram for implementing the output driver of FIG. 1.

Output drivers 108, such as is shown in FIG. 1, are preferably current mode drivers, which are designed to drive the bus 102 with an amount of current substantially independent of the supply voltage provided to the device. The output driver, however, preferably generates various drive capabilities in accordance with the load on the bus. For example, if the bus is heavily loaded with memory modules, the output driver preferably should generate a larger amount of current to drive a larger load. On the other hand, if the bus is lightly loaded, the output driver preferably should generate a smaller amount of current to drive a smaller load. FIG. 2 illustrates a prior art output driver 108 that drives one channel of the bus 102. The output driver 108 includes an output port 204 for connecting the output driver to the bus 102, a transistor 202 for driving the output port, a buffer 208 for driving the gate terminal of the transistor 202, a bias current source 216 and resistor 218 for providing a reference gate voltage 214, a gate capacitor 210 coupling to the reference voltage 214 for driving the buffer 208, and a data input 212. The drain terminal of the transistor 202 connects to the output port 204 and the source terminal of the transistor 202 connects to the circuit ground. The data input 212 is coupled to the input of the buffer 208 and the output of the buffer 208, node 206, is coupled to the gate terminal of the transistor 202. Node 206 controls the current drawn by transistor 202 from the bus 102.

One of the problems of the output driver illustrated in FIG. 2 is that the low threshold voltage transistor 202 may be damaged due to gate stress and electro-static discharge (ESD) caused by a large voltage swing on the bus. If a high threshold voltage transistor is used, a larger capacitor 210 is necessary to provide the power for driving the buffer 208.

Another problem with the output driver of FIG. 2 is that at the low internal voltage supply (e.g., 1.0 volts) used in many modern low power circuits, the output driver may not drive a sufficiently large voltage swing onto the bus 102.

Yet another problem with the output driver of FIG. 2 is that the internal impedance of the output driver is not adjustable. Without the capability to adjust the internal impedance, the output driver may not be able to account for the variation in topology, signal frequency, and other electrical characteristics of the bus in producing an optimal transmit signal when communicating with other devices on the bus.

Yet another problem with the output driver of FIG. 2 is that the internal impedance of the circuit is not controlled with respect to the frequency, power supply, process and temperature variations of the system.

In view of the shortcomings of the prior art, it is an objective to provide an output driver that can produce a large voltage swing on the bus with a low internal voltage supply. It is another objective to provide an output driver that can drive high frequency signals. It is another objective to provide an output driver that meets ESD and gate stress requirements. It is another objective to provide an output driver to which the internal impedance is adjustable, after completion of manufacturing, to optimize the signal quality required by the receiving device. It is another objective to provide an output driver that has an internal impedance that tracks the frequency, internal voltage, process and temperature variations of the system. More generally, it is an objective to provide an output driver with these characteristics.

BRIEF DESCRIPTION OF THE DRAWINGS

The aforementioned features and advantages of the invention as well as additional features and advantages thereof will be more clearly understood hereinafter as a result of a detailed description of embodiments of the invention when taken in conjunction with the following drawings.

DESCRIPTION OF THE EMBODIMENTS

An output driver has an output port for outputting a data signal, a level shifter for driving a current to the output port in response to a current control signal, an adjustable impedance controller for generating an impedance adjustment signal, and an output impedance compensator for adjusting the impedance of the level shifter in accordance with the impedance adjustment signal and in accordance with a reference voltage. In some embodiments, the output driver also includes a tracking circuit, including a process and temperature monitor responsive to manufacturing process and temperature variations of the output driver, a frequency monitor responsive to the frequency of an input clock signal, and a voltage supply monitor responsive to an internal power supply voltage. The process and temperature monitor, frequency monitor and voltage supply monitor are interconnected so as to generate the reference voltage.

Figure 3:
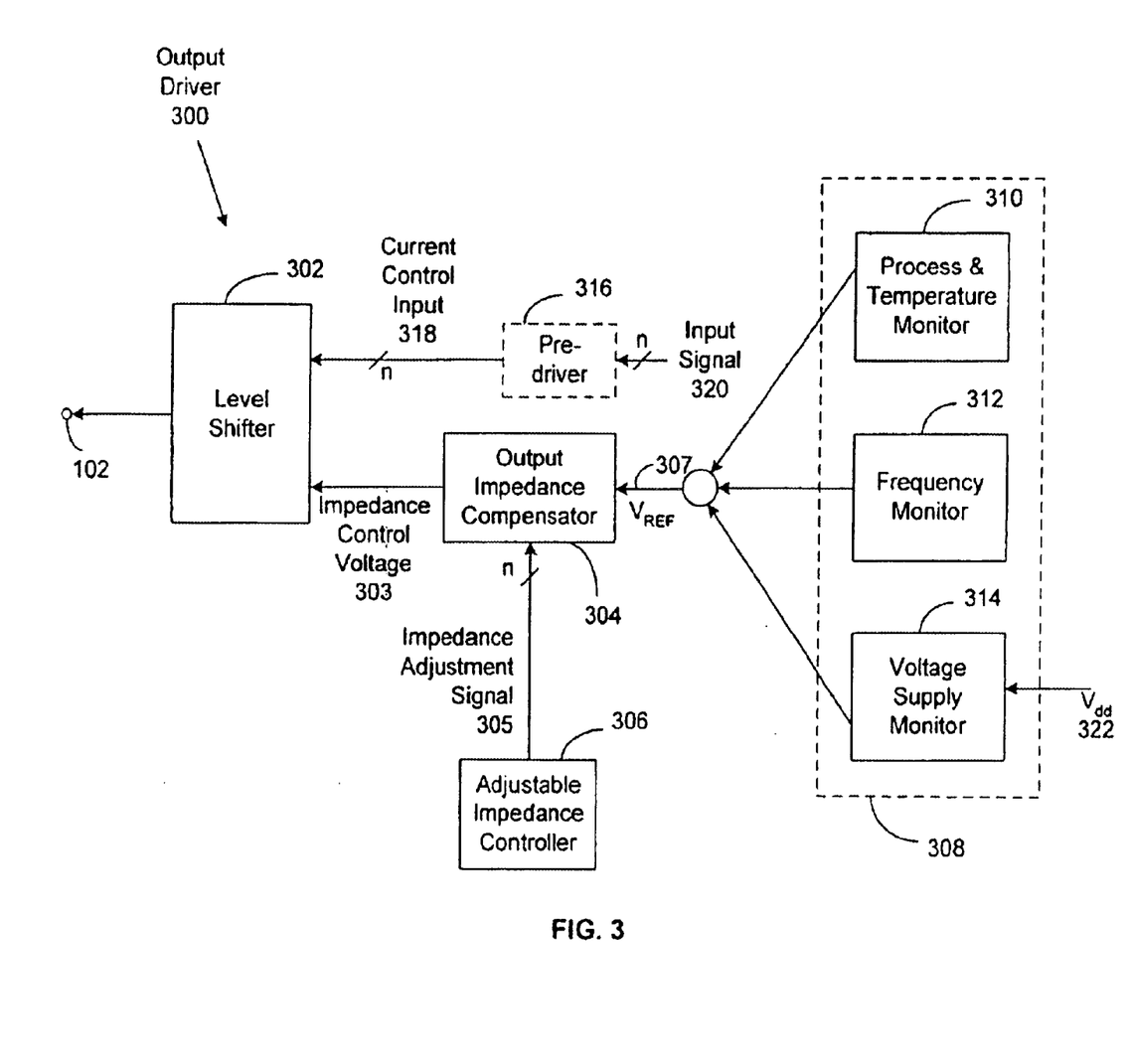
FIG. 3 illustrates a block diagram of an exemplary implementation of an improved output driver.

FIG. 3 illustrates a block diagram of an exemplary implementation of an improved output driver 300. The output driver 300 is implemented on a single integrated circuit, along with other circuitry (not shown) that produces a signal (e.g., input signal 320) to be transmitted to another integrated circuit via a bus 102 or other electrical interconnect. The output driver 300 includes a level shifter 302, an output impedance compensator 304, an adjustable impedance controller 306. The level shifter 302 drives a current onto the bus 102 in response to a current control input signal 318. The impedance of the level shifter 302 is controlled by an impedance control voltage 303 generated by the output impedance compensator 304. The output impedance compensator 304 adjusts the impedance of the level shifter in accordance with an impedance adjustment signal 305 and in accordance with a reference voltage $V_{REF}$ on node 307. In some embodiments, as described below, the impedance adjustment signal 305 comprises a set of n impedance adjustment signals. The adjustable impedance controller 306 generates the impedance adjustment signal 305 that is used by the output impedance compensator 304 to adjust the impedance of the output driver circuit. The current control input signal 318 may be input signal 320 or may be generated by a pre-driver 316 which amplifies the input signal 320.

The output driver of the present disclosure may be made using semiconductor manufacturing processes designed to produce at least two types of transistors (e.g., two types of n-channel MOSFET's). In one embodiment, the manufacturing process is a CMOS process that produces at least one type of p-channel transistor and at least two types of n-channel transistors. A first type of transistor produced by the manufacturing process is a relatively low threshold voltage thin-oxide transistor (e.g., having a threshold of less than about 0.4 volts, and preferably between 0.2 and 0.3 volts), suitable for fast internal signal switching. However, this type of transistor, due to its thin gate oxide, is susceptible to damage caused by electrostatic discharge (ESD), and it's gate can be stressed if used at a voltage higher than about 110% of the specified allowed maximum voltage. A second type of transistor produced by the manufacturing process is a high threshold voltage transistor (e.g., having a threshold of about 0.7 to about 0.9 volts), preferably used for driving signals to communicate with external devices. High threshold voltage transistors typically have a relatively thick gate oxide layer. This second type of transistor has higher tolerance for ESD and is less likely to be damaged by ESD or to be stressed by drive voltages slightly higher than the specified allowed maximum drive voltage for the device. However, this high threshold voltage transistor may not operate as well as would be desired when it is switched on and off at the rates associated with high frequency applications because of the higher threshold voltage required to operate the transistor. In addition, the high threshold voltage can be as high as or sometimes higher than the internal power supply, making the second type of transistor unsuitable for driving signals at the speeds and with the accuracy needed to communicate with external devices in a low internal power supply environment.

In some embodiments, the output driver 300 includes a tracking circuit 308. The tracking circuit 308 includes a process and temperature monitor 310, a frequency monitor 312 and a voltage supply monitor 314. The process and temperature monitor 310 adjusts the reference voltage in response to manufacturing process and temperature variations. The frequency monitor 312 adjusts the reference voltage in response to the frequency of an input clock signal. The voltage supply monitor 314 adjusts the reference voltage in response to the variations of an internal power supply $V_{dd}$ 322. In one embodiment, the process and temperature monitor 310, the frequency monitor 312 and the voltage supply monitor 314 all contribute to modify the reference voltage $V_{REF}$ on node 307. In other embodiments, the tracking circuit 308 includes only a subset of these monitors, such as one or more monitors 310, 312 or 314, and/or includes other monitors or tracking circuits.

Figure 4:
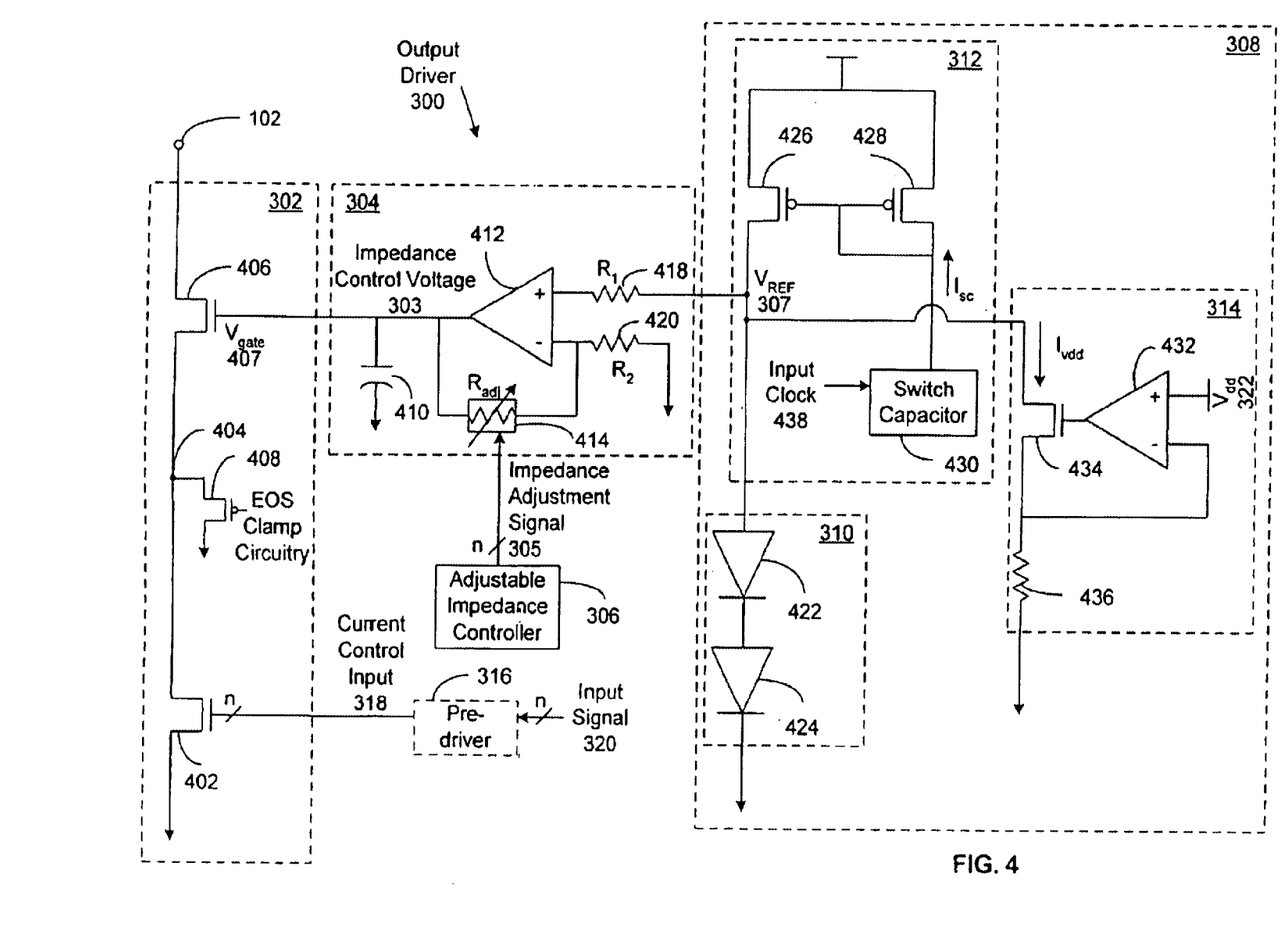
FIG. 4 illustrates a circuit diagram of the output driver in FIG. 3.

FIG. 4 is a circuit diagram of the improved output driver 300 in FIG. 3. As illustrated, the level shifter 302 includes transistors 402, 406 and 408. In some embodiments, transistors 402 and 406 have the same or essentially the same threshold voltages and/or gate-oxide thicknesses. In other embodiments however, the level shifter 302 includes a low threshold voltage thin-oxide transistor 402, and a high threshold voltage thick-oxide transistor 406. The level shifter 302 also includes an electrical overstress (ESO) protection transistor 408. The basic operation of the output driver 300 is that a high frequency input signal 320 is amplified and driven onto the bus 102 by transistor 402, while transistor 406 has a impedance that is controlled by all the circuitry to the right of that transistor. By suitably controlling the impedance of transistor 406, the strength of the current drive as applied to the bus 102 is controlled. Although as illustrated in FIG. 4, both transistors 402 and 406 are NMOS transistors, it should be noted that transistors 402 and 406 may be implemented using other transistors (e.g., PMOS transistors) and/or different types of transistors (e.g., one may be a NMOS transistor and the other a PMOS transistor).

The drain terminal of the high threshold voltage thick-oxide transistor 406 is coupled to the bus 102, the gate terminal of transistor 406 is coupled to the output impedance compensator 304, and the source terminal of transistor 406 is coupled to the drain terminal of the low threshold voltage thin-oxide transistor 402 via circuit node 404. The gate terminal of the transistor 402 receives a current control input 318 from the pre-driver 316, which in turn amplifies an input data signal 320 to be transmitted onto the bus 102. The source terminal of the transistor 402 is coupled to the circuit ground. Transistor 408 prevents circuit node 404 from reaching an excessively high voltage (e.g., due to an electrostatic discharge on bus 102). The drain terminal of the EOS protection transistor 408 is coupled to node 404, the gate terminal of transistor 408 coupled to an EOS clamp circuit and the source terminal of transistor 408 is coupled to the circuit ground. Transistor 408 is biased so that when the voltage on node 404 exceeds the maximum allowed voltage for that node, transistor 408 turns on and thereby drains off the excess charge on node 404. This protects transistor 402, which is not suited for exposure to high voltages on its drain. The EOS clamp circuit, not shown, sets the voltage on the gate of transistor 408 to approximately the maximum allowed voltage on node 404 minus the threshold voltage of transistor 408.

In one embodiment, the transistor 402 is implemented as a plurality of low threshold voltage thin-oxide transistors 402*i* (i=1 to n, where n is an integer greater than 1) connected in parallel between node 404 and circuit ground. The drain terminals of the transistors 402*i* are connected to node 404 and the source terminals of the transistors 402*i* are tied to the circuit ground. The parallel transistors 402*i* may be of equal size, but more preferably are sized so that the current drive capabilities of the transistors, given identical gate, drain and source voltages are binary weighted (i.e., 1×, 2×, 4×, etc.). The gate terminals of the parallel transistors 402*i* receive corresponding current control inputs signals 318*i* (i=1 to n) from the pre-driver 316.

The output driver as illustrated in FIG. 4 is capable of transmitting the input signal 320 onto the bus 102 with the combination of a fast switching low threshold voltage transistor 402 and a high threshold voltage transistor 406. The low threshold voltage transistor 402 is driven by a low voltage internal power supply. The low threshold voltage transistor 402 may be driven like a switch by the current control input signal 318. The output driver works well with a low internal power supply voltage $V_{dd}$ 322 because the low threshold voltage of transistor 402 allows that transistor to be switched on using a correspondingly low voltage signal. The size of the high threshold voltage transistor 406 is approximately equal to or slightly larger than the minimum size that still satisfies the ESD requirements for a particular design. The bulk of the transistor 406 is tied to circuit ground to shunt away ESD current. With the ESD protection provided by transistor 406, a large amount of current may be driven by the output driver 300 without risking damage to the fast switching low threshold voltage transistor 402.

The internal impedance of the output driver 300 determines the amount of current driven onto the bus 102 to the receiving device, and determines the amount of current to be consumed by the internal circuitry of the output driver. Under normal conditions, an output driver with a relatively high internal impedance would not substantially alter the impedance of the bus 102, thus allowing the output driver to drive most of the current to the bus 102. As a result, only a small portion of the current is consumed by the internal circuitry. In addition, an adjustable internal impedance is desirable for the output driver to accommodate variations in topology, bus frequency, and other electrical characteristics of the system.

The output impedance compensator 304 includes a $V_{gate}$ capacitor 410, an operational amplifier 412, and an adjustable resistor 414. A first resistor $R_1$ 418 is coupled between the positive terminal of the operational amplifier and the tracking circuit 308. A second resistor $R_2$ 420 is coupled between the negative terminal of the operational amplifier and the circuit ground. In one embodiment, the relationship between the first resistor 418 and the second resistor 420 is $R_1=R_2/2$. The adjustable resistor 414 connects the output of the operational amplifier 412 to the negative input of the operational amplifier. The tracking circuit provides a reference voltage $V_{REF}$ on node 307. The operational amplifier 412 provides an amplification of the reference voltage $V_{REF}$ by a factor of $(1+R_{adj}/R_2)$. The reference voltage provided by the tracking circuit 308 may have been adjusted in accordance with process, temperature, frequency and/or internal power supply variations. The gate voltage $V_{gate}$ on gate node 407 of the high threshold thick-oxide transistor 406 can be controlled by adjusting the impedance of the adjustable resistor 414, which in turn adjusts the internal impedance of the output driver. The ability to tune the internal impedance allows the output driver 300 to generate a signal level that is most desirable for communicating with a particular device on the bus.

In some embodiments, the output driver of the present disclosure also includes a tracking circuit. The tracking circuit may include one or more of a process and temperature monitor responsive to manufacturing process and temperature variations of the output driver, a frequency monitor responsive to the frequency of an input clock signal, and a voltage supply monitor responsive to an internal power supply voltage. In one embodiment, the process and temperature monitor, frequency monitor and voltage supply monitor are interconnected so as to generate the reference voltage. In the circuit shown in FIG. 4, the $V_{gate}$ capacitor 410 need not provide power to the pre-driver 316, since the pre-driver 316 receives its power from the internal power supply $V_{dd}$. Therefore, the $V_{gate}$ capacitor 410 can be eliminated or its size can be reduced significantly. In addition, detaching the $V_{gate}$ capacitor from the power supply eliminates a noise source to the output signal. The gate voltage $V_{gate}$ on node 407 is derived from the reference voltage $V_{REF}$ on node 307 from the tracking circuit. The operational amplifier 412 acts as a filter that filters out power supply noise in the reference voltage. Thus, a significant portion of the noise that would otherwise be present at the gate terminal of the transistor 406 may be eliminated. Another benefit of reducing the size of $V_{gate}$ capacitor 410 is that it allows the voltage at the gate terminal 407 of transistor 406 to be adjusted quickly to provide active output impedance control. In an alternative embodiment, the $V_{gate}$ capacitor 410 is eliminated by incorporating it into the operational amplifier. This is because the operational amplifier 412 may be configured to act as a low pass filter, thus replacing the function of the $V_{gate}$ capacitor 410.

In some embodiments, the process and temperature monitor 310 includes two diodes 422 and 424 connected in series. In some such embodiments, the two diodes 422 and 424 (which may be implemented as diode connected transistors) resemble the level shifter transistors 402 and 406 in that all four transistors are manufactured with the same process and their electrical characteristics are closely related. The variations of gate voltage $V_{gate}$ on gate node 407 of the high threshold voltage transistor 406 due to temperature and manufacturing process can be monitored with the combined threshold voltages of the diodes 422 and 424 in series.

In some embodiments, the frequency monitor 312 includes a switch capacitor 430, a current source that contains a pair of p-channel transistors 426 and 428 (e.g., PMOS transistors), and an input clock signal 438 that provides a frequency reference to the circuit. The frequency of the input clock signal is a function of the maximum data rate of the signals transmitted over the bus 102. For instance, the input clock signal 438 can be a copy of, or a signal derived from, a system clock signal that is transmitted in parallel with the data asserted on the bus 102. The switch capacitor 430 produces a bias current $I_{SC}$ that tracks the frequency of the input clock signal. When the input clock frequency increases, the corresponding amount of current flowing out of the switch capacitor $I_{SC}$ also increases. When the input clock frequency decreases, the corresponding amount of current flowing out of the switch capacitor $I_{SC}$ also decreases. Since portions of the bias current $I_{SC}$ flow through the pair of diodes 422 and 424, when $I_{SC}$ increases, more current flows through the diodes and causes the reference voltage $V_{REF}$ 307 to increase. When $I_{SC}$ decreases, less current flows through the diodes and causes the reference voltage $V_{REF}$ on node 307 to decrease.

In some embodiments, the voltage supply monitor 314 includes an operational amplifier 432, a transistor 434 and a resistor 436. The positive terminal of the operational amplifier 432 is coupled to the voltage supply $V_{dd}$, the output terminal of the operational amplifier is coupled to the gate terminal of the transistor 434 and the negative terminal of the operational amplifier is coupled to the source terminal of the transistor 434. The drain terminal of transistor 434 is coupled to the reference voltage $V_{REF}$ on node 307 of the tracking circuit 308, and the source terminal of the transistor 434 is coupled to circuit ground through the resistor 436. The voltage supply monitor 314 monitors the variation of the internal power supply $V_{dd}$ in such a manner that when the internal $V_{dd}$ increases, the operational amplifier 432 outputs a larger voltage signal to the gate of the transistor 434, which causes a larger current $I_{vdd}$ to flow through transistor 434. As a result, a smaller portion of the $I_{SC}$ current would flow through the diodes 422 and 424, which in turn causes the reference voltage $V_{REF}$ on node 307 to decrease. On the other hand, when the internal $V_{dd}$ decreases, the operational amplifier 432 outputs a smaller voltage signal to the gate of the transistor 434, which causes a smaller current $I_{vdd}$ to flow through transistor 434. As a result, a larger portion of the $I_{SC}$ current would flow through the diodes 422 and 424, which in turn causes the reference voltage $V_{REF}$ on node 307 to increase. Hence, variations in the internal power supply $V_{dd}$ are tracked by the reference voltage $V_{REF}$ on node 307 of the tracking circuit 308, and the internal impedance of the output driver 300 is adjusted as a function of the variation in internal power supply voltage.

Figure 5A:
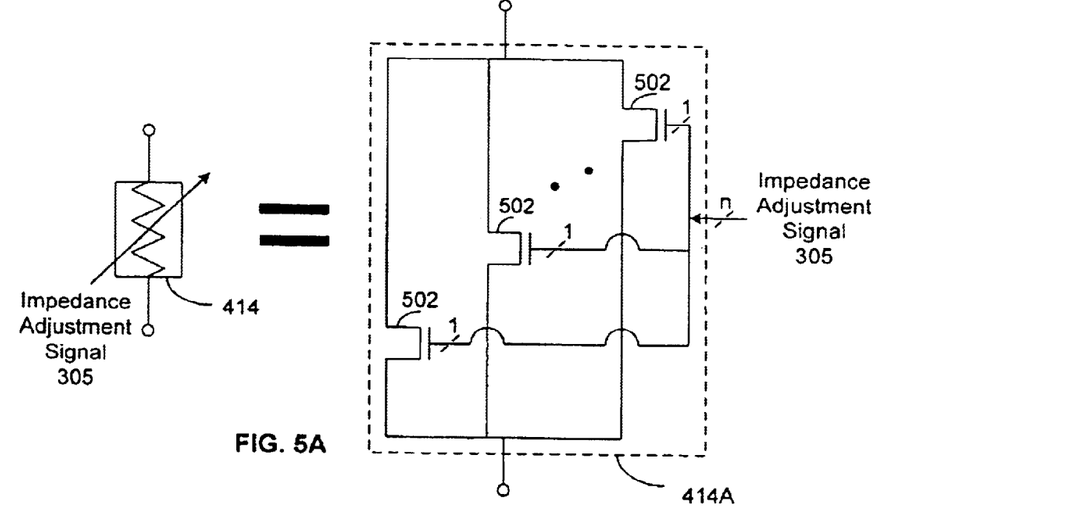
FIG. 5A illustrates an exemplary implementation of the adjustable resistor of FIG. 4.

FIG. 5A illustrates an exemplary implementation 414A of the adjustable resistor 414 of FIG. 4. As shown in FIG. 5A, the adjustable resistor 414 can be implemented as a group of n transistors 502 connected in parallel with each other, where n is an integer greater than one. The drain terminals of the transistors 502 are connected together and the source terminals of the transistors 502 are connected together. Each of the gate terminals of the n transistors 502 is coupled to a corresponding input impedance adjustment signal of a set of n impedance adjustment signals 305. The resistance of each individual transistor 502 is adjusted by turning on or off the corresponding one of the impedance adjustment signals 305. The total resistance of the group of transistors is the resultant resistance of the transistors 502 connected in parallel.

Figure 5B:
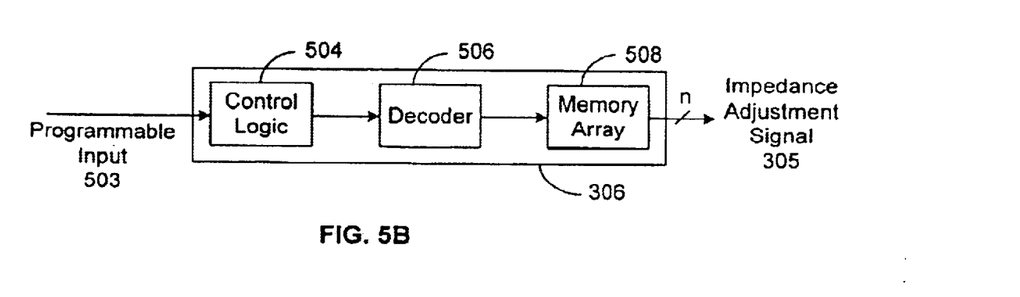
FIG. 5B illustrates one approach for adjusting the impedance of the output driver.

FIG. 5B illustrates one approach for adjusting the impedance of the output driver 300. In this embodiment, the adjustable impedance controller 306 includes a control logic block 504, a decoder 506 and a memory array 508. The control logic 504 receives a programmable input 503 and computes an address for the decoder block 506 in accordance with the programmable input. The programmable input may be generated by a microprocessor or by a controller of a system. The programmable input, which includes or is derived from information concerning one or more characteristics of the system in which the output driver is used, may contain or be based upon topology information of the system (e.g., the number of devices connected to bus 102, possibly also including the positions of the devices on the bus 102). In some embodiments, the programmable input is also based on one or more additional system characteristics such as the bus frequency and other electrical characteristics of the system. The decoder 506 decodes the address and determines a specific location in the memory array 508 where a predetermined impedance adjustment signal 305 (or set of adjustment signals 305) is stored. This impedance adjustment signal is in turn used to control the adjustable resistor 414 for generating an adjustable resistance value.

Figure 5C:
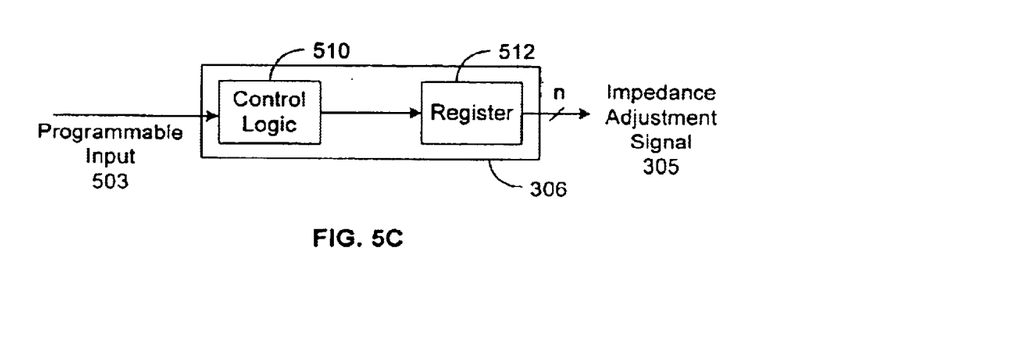
FIG. 5C illustrate another approach for adjusting the impedance of the output driver.

FIG. 5C illustrates another approach for adjusting the impedance of the output driver 300. In this approach, the adjustable impedance controller 306 includes control logic 510 and a register 512. The control logic 510 receives a programmable input 503 and computes a set of control signals in accordance with the programmable input. The programmable input may be generated by a microprocessor or by a controller of a system. The programmable input, which includes or is derived from information concerning one or more characteristics of the system in which the output driver is used, may contain or be based upon topology information of the system. In some embodiments, the programmable input is also based on one or more additional system factors such as the bus frequency and other electrical characteristics of the system. The set of control signals are stored in the register 512. The output of the register 512 is the impedance adjustment signal 305, which is used to control the adjustable resistor 414 (see FIGS. 4, 5A) for generating an adjustable resistance value.

The output driver of the present disclosure may be used in any circuit that outputs a signal, including for example output driver 108 in any one or more of the memory controller 104, memory modules 106 and DRAMs of FIG. 1. The output driver of the present disclosure may also be used by a first portion of an integrated circuit to, for example, output a signal for use by another portion of the same integrated circuit. The disclosed output driver provides at least four advantages. First, the output driver can drive a large voltage swing onto the bus 102 using an internal voltage supply smaller than the voltage swing of the output signal being driven and at the same time meeting the ESD and EOS requirements of a particular design. Second, the output driver can assert signals onto the bus 102 at a higher frequency by eliminating or reducing the size of the capacitor loading at the gate of the output transistor 406. Third, it allows the output driver to fine tune the output signal by adjusting its internal impedance on a per device basis. This adjustment can be done even after the integrated circuit that contains the output driver is manufactured and the integrated circuit is placed on a printed circuit board. For instance, as described above (see description of FIGS. 5B and 5C), the internal impedance of the output driver can be determined in accordance with a programmable input, and the programmable input may be based at least in part on one or more characteristics (e.g., the number of devices on the bus 102, operating frequency, and other aspects of system or bus topography) of the system in which the output driver is used. Fourth, it provides adjustment to the internal impedance of the output driver by tracking the process, temperature, frequency and internal power supply variations.

One skilled in the relevant art will easily recognize that the present invention can be implemented in many ways, using many modifications of the disclosed exemplary circuits. For example, tracking circuit 308 may include just one, or just two of the three monitor circuits used in the embodiment shown in FIGS. 3 and 4. The tracking circuit 308 furthermore may include other types of monitor circuits in addition to, or in place of, one or more of the monitor circuits used in the above described embodiments. Other embodiments of the adaptive impedance output driver circuit may not include a tracking circuit at all.

The foregoing description, for purpose of explanation, has been described with reference to specific embodiments. However, the illustrative discussions above are not intended to be exhaustive or to limit the invention to the precise forms disclosed. Many modifications are variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated.

What is claimed is:

1. An output driver, comprising:
an output port configured to output a data signal;
a level shifter configured to drive a current to said output port in response to an input signal;
an adjustable impedance controller configured to generate an impedance adjustment signal in accordance with topology information; and
an output impedance compensator configured to adjust the impedance of said level shifter in accordance with said impedance adjustment signal and in accordance with a reference voltage,
wherein said level shifter includes a first transistor for providing electro-static discharge protection, wherein said first transistor has a drain terminal coupled to said output port and a gate terminal coupled to a voltage output of said output impedance compensator, and a second transistor for outputting a signal with an output drive current in response to said input signal, wherein said second transistor has a drain terminal coupled to the source terminal of said first transistor, a source terminal coupled to circuit ground, and a gate terminal coupled to said input signal.

2. The output driver of claim 1, wherein the first transistor has a thicker oxide layer than the second transistor.

3. The output driver of claim 1, wherein the first transistor has a higher threshold voltage than the second transistor.

4. The output driver of claim 1, wherein said input signal comprises a plurality of pre-amplified data signals, the second transistor comprises a plurality of parallel transistors, the each having a gate connected to receive a respective one of the pre-amplified data signals.

5. The output driver circuit of claim 2, wherein the adjustable impedance controller is configured to generate the impedance adjustment signal in response to a programmable input.

6. The output driver of claim 5, wherein the adjustable impedance controller includes a memory array and a decoder configured to access the memory array in response to the programmable input.

7. The output driver of claim 6, wherein the programmable input is based at least in part on one or more characteristics of a system in which the output driver is used.

8. The output driver of claim 5, wherein the programmable input is based at least in part on one or more characteristics of a system in which the output driver is used.

9. An output driver, comprising:
an output port configured to output a data signal;
a level shifter configured to drive a current to said output port in response to an input signal;
an adjustable impedance controller configured to generate an impedance adjustment signal in accordance with topology information; and
an output impedance compensator configured to adjust the impedance of said level shifter in accordance with said impedance adjustment signal and in accordance with a reference voltage;
wherein said output impedance compensator comprises:
an operational amplifier circuit, wherein said operational amplifier circuit has a positive input terminal coupled to a reference voltage input through a first resistor, a negative input terminal coupled to circuit ground through a second resistor; and
an adjustable resistor configured to connect the output of said operational amplifier to said negative input terminal of said operational amplifier.

10. The output driver of claim 9, wherein said adjustable resistor comprises a plurality of parallel transistors configured to receive said impedance adjustment signal.

11. The output driver of claim 10, wherein the impedance adjustment signal comprises a plurality of impedance adjustment signals stored in a memory element within the adjustable impedance controller.

12. An output driver, comprising:
an output port configured to output a data signal;
a level shifter configured to drive a current to said output port in response to an input signal;
an adjustable impedance controller configured to generate an impedance adjustment signal in accordance with topology information; and
an output impedance compensator configured to adjust the impedance of said level shifter in accordance with said impedance adjustment signal and in accordance with a reference voltage;
further comprising:
a tracking circuit, wherein the tracking circuit includes at least one monitor selected from the group consisting of: a process and temperature monitor, a frequency monitor, and a voltage supply monitor.

13. The output driver of claim 12, wherein
when the tracking circuit includes a process and temperature monitor, the process and temperature monitor is configured to adjust the reference voltage in response to manufacturing process and temperature variations of said output driver;
when the tracking circuit includes a frequency monitor, the frequency monitor is configured to provide a frequency component to the reference voltage in response to the frequency of the input clock signal; and
when the tracking circuit includes a voltage supply monitor, the voltage supply monitor is configured to adjust the reference voltage in accordance with an internal power supply voltage.

14. The output driver of claim 13, wherein said process and temperature monitor comprises a plurality of diodes connected in series.

15. The output driver of claim 13, wherein said frequency monitor comprises:
an input clock signal;
a current source coupled to a power supply; and
a switched capacitor circuit coupled to said current source, said switched capacitor circuit drawing an amount of current from said current source based on a predetermined frequency of said input clock signal.

16. The output driver of claim 13, wherein said voltage supply monitor comprises:
an operational amplifier having a positive terminal coupled to an internal power supply; and
a transistor having a drain terminal coupled to a current source, a gate terminal coupled to an output of said operational amplifier, a source terminal coupled to a negative terminal of the operational amplifier and to a circuit ground via a resistor.

17. An output driver comprising:
an output port;
a first transistor for configured to provide electrostatic discharge protection, wherein said first transistor has a drain terminal coupled to said output port and a gate terminal coupled to an impedance compensator; and a second transistor configured to output a signal with an output drive current in response to an input signal, wherein said second transistor has a drain terminal coupled to the source terminal of said first transistor, a source terminal coupled to circuit ground, and a gate terminal coupled to said input signal.

18. The output driver of claim 17, wherein the first transistor has a thicker oxide layer than the second transistor.

19. The output driver of claim 17, wherein the first transistor has a higher threshold voltage than the second transistor.

20. The output driver of claim 17, including a third transistor configured to provide electrical overstress protection, wherein said third transistor has a drain terminal coupled to the source terminal of said first transistor, a source terminal coupled to circuit ground, and a gate terminal coupled to an input from an electrical overstress clamp circuit.

21. The output driver of claim 17, wherein said input signal comprises a plurality of pre-amplified data signals, the second transistor comprises a plurality of parallel transistors, each having a gate connected to receive a respective one of the pre-amplified data signals.

22. The output driver of claim 17, wherein said impedance compensator comprises:

an operational amplifier circuit, wherein said operational amplifier circuit has a positive input terminal coupled to a reference voltage input through a first resistor, a negative input terminal coupled to circuit ground through a second resistor; and an adjustable resistor configured to connect the output of said operational amplifier to said negative input terminal of said operational amplifier.

23. The output driver of claim 22, wherein said adjustable resistor comprises a plurality of parallel transistors configured to receive an impedance adjustment signal.

24. The output driver of claim 23, wherein the impedance adjustment signal comprises a plurality of impedance adjustment signals stored in a memory array.

25. The output driver of claim 22, wherein said reference voltage is generated by a tracking circuit, the tracking circuit including at least one monitor selected from the group consisting of: a process and temperature monitor, a frequency monitor, and a voltage supply monitor.

26. The output driver of claim 25, wherein when the tracking circuit includes a process and temperature monitor, the process and temperature monitor is configured to adjust the reference voltage in response to manufacturing process and temperature variations of said output driver;

when the tracking circuit includes a frequency monitor, the frequency monitor is configured to provide a frequency component to the reference voltage in response to the frequency of the input clock signal; and when the tracking circuit includes a voltage supply monitor, the voltage supply monitor is configured to adjust the reference voltage in accordance with an internal power supply voltage.

27. The output driver of claim 25, wherein said process and temperature monitor comprises a plurality of diodes connected in series.

28. The output driver of claim 25, wherein said frequency monitor comprises:

an input clock signal;

a current source coupled to a power supply; and a switched capacitor circuit coupled to said current source, said switched capacitor circuit drawing an amount of current from said current source based on a predetermined frequency of said input clock signal.

29. The output driver of claim 25, wherein said voltage supply monitor comprises:

an operational amplifier having a positive terminal coupled to said internal power supply; and a transistor having a drain terminal coupled to a current source, a gate terminal coupled to an output and a negative input terminal of said operational amplifier, a source terminal coupled to a circuit ground via a resistor.

30. The output driver of claim 17, wherein the impedance compensator comprises a circuit responsive to an impedance adjustment signal, and the output driver includes a controller configured to generate the impedance adjustment signal in response to a programmable input.

31. The output driver of claim 30, wherein the controller includes a memory array and a decoder configured to access the memory array in response to the programmable input.

32. The output driver of claim 30, wherein the programmable input is based at least in part on one or more characteristics of a system in which the output driver is used.

33. An output driver comprising:

output means for outputting a data signal;

level shift means for driving a current to said output port in response to an input signal;

control means for generating an impedance adjustment signal; and compensator means for adjusting the impedance of said level shifter in accordance with said impedance adjustment signal and in accordance with a reference voltage.

* * * * *

UNITED STATES PATENT AND TRADEMARK OFFICE
CERTIFICATE OF CORRECTION

| | |
|---|---|
| PATENT NO. | : 7,088,127 B2 |
| APPLICATION NO. | : 10/662204 |
| DATED | : August 8, 2006 |
| INVENTOR(S) | : Ngyuen et al. |

Page 1 of 1

It is certified that error appears in the above-identified patent and that said Letters Patent is hereby corrected as shown below:

Title Page:

Item (12), the inventor name of "Ngyuen et al." should read --Nguyen et al.--

Item (73), Inventors: the name "Huy M. Ngyuen" should read --Huy M. Nguyen--

In the Claims:

Column 12, line 45, after "signal" please delete ";" and please insert --in accordance with topology information; and--.

Column 12, line 51, after "voltage" please delete "." and insert --;--.

Column 12, after line 51, please insert as a new subparagraph --wherein said level shift means includes a first transistor means for providing electrostatic discharge protection, and wherein said first transistor means is coupled to a voltage output of said compensator means, and a second transistor means for outputting a signal with an output drive current in response to said input signal.--

Signed and Sealed this

Twelfth Day of December, 2006

JON W. DUDAS
*Director of the United States Patent and Trademark Office*